United States Patent [19]

Smith

[11] Patent Number: 4,788,159

[45] Date of Patent: Nov. 29, 1988

[54] PROCESS FOR FORMING A POSITIVE INDEX WAVEGUIDE

[75] Inventor: Frank T. J. Smith, Pittsford, N.Y.

[73] Assignee: Eastman Kodak Company, Rochester, N.Y.

[21] Appl. No.: 908,741

[22] Filed: Sep. 18, 1986

[51] Int. Cl.[4] .................... H01L 7/00; H01L 21/205; H01S 3/19
[52] U.S. Cl. ..................................... 437/90; 437/219; 437/133; 372/48
[58] Field of Search ....................... 29/569 L; 357/17; 372/43, 48; 437/90, 129, 133

[56] References Cited

U.S. PATENT DOCUMENTS

| | | | |
|---|---|---|---|
| 4,137,107 | 1/1979 | Nijman et al. | 148/171 |
| 4,360,919 | 11/1982 | Fujiwara et al. | 372/45 |
| 4,371,968 | 2/1983 | Trussell, Jr. et al. | 372/50 |
| 4,467,521 | 8/1984 | Spooner et al. | 156/612 |
| 4,532,631 | 7/1985 | Shima et al. | 372/48 |
| 4,567,060 | 1/1986 | Hayakawa et al. | 437/133 |
| 4,569,721 | 2/1986 | Hayakawa et al. | 437/133 |
| 4,734,385 | 3/1988 | Mihashi et al. | 437/129 |

FOREIGN PATENT DOCUMENTS

| | | | |
|---|---|---|---|
| 0113677 | 6/1984 | Japan | 29/569 L |
| 0181078 | 10/1984 | Japan | 437/129 |

OTHER PUBLICATIONS

Wang et al., J. Vac Sci., Technol. B 4(2) (Mar/Apr. 1986) pp. 629–630.
Li et al., J. Electrochem., Soc.: Solid-State Science and Technology v. 130 (Oct. 1983) pp. 2072–2075.

Primary Examiner—Olik Chaudhuri
Attorney, Agent, or Firm—Carl O. Thomas

[57] ABSTRACT

A process of preparing a laterally confined positive index waveguide is disclosed in which a monocrystalline substrate comprised of a III–V compound is provided having adjacent one major surface monocrystalline gallium aluminum arsenide having a resistivity greater than $10^5$ ohm-cm. A protective layer is provided on the substrate, and a channel is opened in the substrate to expose an unprotected portion of the substrate. A waveguide region is formed by selectively depositing epitaxially on only the unprotected portion of the substrate at least one III–V compound of a higher refractive index than the substrate monocrystalline gallium aluminum arsenide. Epitaxial deposition is terminated when the waveguide region forms with the one major surface an overall planar surface, and at least on layer bridging the substrate and the waveguide region is deposited on the planar surface.

18 Claims, 2 Drawing Sheets

PROCESS FOR FORMING A POSITIVE INDEX WAVEGUIDE

FIELD OF THE INVENTION

This invention is directed to a process of semiconductor device manufacture. More specifically, this invention is directed to a process of preparing a positive index waveguide.

BACKGROUND OF THE INVENTION

In preparing monolithically integrated semiconductor components (also referred to as chips) distinct advantages have been recognized to result from employing monocrystalline semiconductive substrates presenting planar surfaces—i.e., surfaces having the low levels of relief common to semiconductor devices fabricated using planar processing. Planar surfaces exhibit a relief variance of a micrometer ($\mu m$) or less.

When monocrystalline semiconductive substrates exhibit surface relief in excess of about 1 $\mu m$, particularly when these relief differences are exhibited by next adjacent chip components, manufacturing difficulties arise leading to reduced yields. As the relief differences between adjacent chip elements increases, the slope of connecting surfaces of the substrate increases, shifting from a horizontal orientation toward a vertical orientation. As surface orientations become increasingly sloped, the choice of techniques by which overlying layers, such as insulative or conductive layers, can be deposited reliably is reduced. Additionally, increased relief differences impose localized reduced radii of curvature on overlying layers. It is at these sites in overlying layers that coating non-uniformities are most common. Further, it is at the low radius of curvature layer locations that stress defects, such as those attributable to differences in thermal expansion characteristics, are most likely to occur.

Botez, "Laser Diodes are Power-Packed", IEEE Spectrum, June 1985, pp. 43-53, provides a state of the art survey of laser diodes as discrete elements. Positive index lasers are disclosed and schematically illustrated.

Although it is a simple matter of Botez to show schmatically planar surfaces for discrete lasers, it has been a problem of long standing in the laser art to find ways of monolithically integrating lasers with other circuit components while achieving workable chip topographies. It is known in the art that a laser can be formed by planar processing. Such lasers are formed by introducing along a substrate surface N and P conductivity type ions in laterally spaced regions so that an active region is created therebetween. While such lasers are ideal in terms of achieving an overall planar surface for a chip, emission efficiency of such lasers is relatively low.

For this reason Botez limits discussion to lasers which consist of a plurality of superimposed semiconductive layers. Lasers can be formed with only three superimposed layers, superimposed N and P conductivity type layers with an active layer intervening. Efficient lasers are typically formed with five or more superimposed layers.

Perhaps the most common approach for preparing a monolithic circuit including a laser is to grow the required laser layers over the entire upper surface of the semiconductive substrate and then to remove these layers by etching from all but the desired laser areas. This produces lasers of the mesa type, with several layers protruding above the lowest common substrate surface. Attempts to overcome the high relief of mesa construction have included subsequently regrowing the substrate epitaxially in etched substrate regions. Unfortunately, this also results in additional deposits on the laser mesa so that ultimately achieving a surface that approaches a planar surface is a laborious undertaking and not readily achieved.

As a result of these difficulties one approach to which the art has resorted in monolithically integrating lasers and other semiconductive circuit components is to increase the lateral distance between the laser and next adjacent component spacing. While this does not reduce the relief difference between the laser surface and the adjacent component surface, it does reduce the slope of the intervening surfaces. Typical integrated circuit arrangements of this type are illustrated by Sanada et al, "Monolithic Integration of a Low Thresold Current Quantum Well Laser and a Driver Circuit on a GaAs Substrate," App. Phys. Lett. 46(3), Feb. 1, 1985, pp. 226-228, and Cohen, "Opto-electronic Chip Integrates Laser and Pair of FETs", Electronics, June 30, 1983, pp. 89 and 90. The inherent disadvantage of increased spacing to achieve reduced slope is that it is incompatible with the higher packing densities of chip components desired for efficient substrate utilization and therefore limits the number of elements which can be accomodated within a given chip area.

Recognizing the difficulties of integrating waveguides such as lasers in multicomponent chips, the art has continued to investigate the properties of waveguide semiconductive materials and the manner in which such materials can be deposited. Ghosh et al, "Selective Area Growth of Gallium Arsenide by Metalorganic Vapor Phase Epitaxy," App. Phys. Lett. 45(11), Dec. 1, 1984, pp. 1229-1231, discloses the selective growth of gallium arsenide by organometallic vapor phase epitaxy on a gallium arsenide substrate partially masked by a silica layer. Tokumitsu et al, "Molecular Beam Epitaxial Growth of GaAs Using Trimethylgallium as a Ga Source," J. App. Phys. 55(8), Apr. 15, 1984, pp. 3163-3165, reports similar selective deposition employing molecular beam epitaxy. Kamon et al, "Selective Epitaxial Growth of GaAs by Low Pressure MOVPE," Journal of Crystal Growth 73 (1985), pp: 73-76, discloses the selective growth of gallium arsenide on gallium arsenide in areas not covered by silica and in "Selective Embedded Growth of AlGaAs by Low-Pressure Organometallic Vapor Phase Epitaxy", Japanese Journal of Applied Physics, 25(1), Jan. 1, 1986, pp. L10-L12, extend their previous disclosure to growing selective gallium aluminum arsenide on an etched substrate.

SUMMARY OF THE INVENTION

In one aspect this invention is directed to a process of preparing a waveguide comprising providing a monocrystalline substrate comprised of a III-V semiconductor, epitaxially growing on the substrate one or more additional layers of a III-V semiconductor differing from the substrate semiconductor, the substrate and the layers together forming a monocrystalline III-V compound structure, wherein the group V ions are arsenic and the group III ions are at least one of gallium and aluminum, characterized in that a laterally confined positive index waveguide presenting a planar surface is formed by providing a substrate having adjacent one major surface monocrystalline gallium aluminum arsenide having a resistivity greater than $10^5$ ohm-cm, providing on the one major surface a protective layer defining an opening, through the opening creating a channel in the substrate to expose an unprotected portion of the substrate beneath the one major surface, forming a waveguide region by selectively depositing epitaxially on only the unprotected portion of the substrate gallium arsenide or gallium aluminum arsenide of a higher refractive index than the substrate monocrystalline gallium aluminum arsenide, terminating epitaxial deposition when the waveguide region forms with the one major surface an overall planar surface, and depositing on the planar surface at least one layer bridging the substrate and the waveguide region, so that the waveguide region acts as a wave propagation medium, the substrate gallium aluminum arsenide acts a lateral isolation medium, and the planar surface formed by the waveguide region and the substrate one major surface facilitates formation of the bridging layer.

The present invention offers a variety of advantages over processes heretofore employed in the art for fabricating laterally confined waveguides, such as lasers, on monocrystalline III-V compound substrates. First, chips with planar surfaces can be readily achieved. Second, the selective deposition of the laser-forming III-V compound at desired laser sites is reliably achieved. It is not necessary to etch away large portions of the substrate in other than laser areas nor to build up epitaxially these other areas after the laser structure is formed in order to achieve the desired planar surface structure. Third, the above advantages can be realized while at the same time choosing the initial composition of the substrate to achieve desired positive index waveguide and electrical isolation characteristics. The process is compatible with achieving layers overlying the semiconductive substrate which are more readily and reliably produced.

BRIEF DESCRIPTION OF THE DRAWINGS

These amd other advantages of this invention can be better appreciated by reference to the following detailed description of the invention, in which.

DESCRIPTION OF PREFERRED EMBODIMENTS

Figure 1:
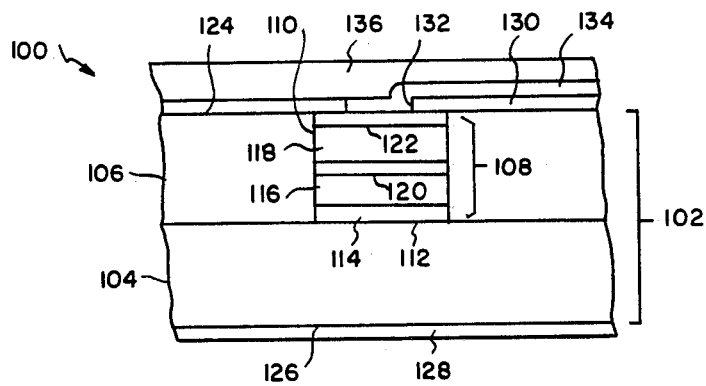
FIG. 1 is a schematic sectional detail of a waveguide constructed according to the process of the present invention.

In FIG. 1 is shown a detail of an exemplary preferred waveguide 100 which can be constructed according to the process of the present invention. The waveguide in the detail shown is comprised of a monocrystalline III-V compound structure consisting of a substrate 102 and a waveguide region 108 epitaxially grown in a channel 110 of the substrate. A first major surface 124 of the substrate and the upper surface of the waveguide region together form an overall planar surface of the waveguide while the substrate alone forms a second major surface 126 of the waveguide. A first electrode 128 serves as an ohmic contact to the second major surface. An insulative layer 130 overlies the planar surface bridging the isolating portion of the substrate and the waveguide region and forms an aperture 132 overlying the waveguide region. A second electrode 134 contacts the upper surface of the waveguide region within the aperture and also laterally traverses at least a portion of the insulative layer. Overlying the second electrode and the insulative layer is an electrically insulative barrier layer 136. It should be noted that though neither the second electrode nor the barrier layer are deposited on a zero relief surface, both are presented with planar surfaces, since the relief variance introduced by providing an aperture through the insulative layer is well within the relief range of a planar surface.

The electrodes and the insulative and barrier layers can be of any convenient conventional composition. Both gold-zinc alloys and titanium nitride are typical electrode materials. The insulative barrier layer is entirely optional, since the waveguide can be mounted in a hermetically sealed housing, if desired. When present, the barrier layer can take the form of a passivating layer, such as a borosilicate glass. The insulative layer can take the form of a chemically vapor deposited insulative material, such as silica or silicon nitride. Additional conductive and/or insulative layers, not shown, can overlie the barrier layer, depending upon the requirements of other, optional device components, not shown.

The substrate 102 in one preferred form is comprised of a more conductive portion 104 typically formed of gallium arsenide containing at least $5 \times 10^{17}$ and preferably from 1 to $3 \times 10^{18}$ N conductivity type ions per cubic centimeter. An isolating portion 106 of the substrate is comprised of an aluminum gallium arsenide layer epitaxially grown on the more conductive portion of the substrate. The isolating portion contains sufficient aluminum to reduce its refractive index below that of the active layer of the waveguide region 108, which it laterally confines, so that it forms with the waveguide region a positive index waveguide. The isolating portion preferably contains about 30 to 60 mole percent aluminum, mole percentages being based on the total group III ions present, except as otherwise indicated. To isolate the waveguide region electrically from any laterally adjacent integrated circuit components, not shown, at least the portion of the substrate adjacent the first major surface exhibits a resistivity of greater than $10^5$ ohm-cm, preferably greater than $10^7$ ohm-cm. Suitable resistivity levels can be achieved by known gallium arsenide deposition techniques, such as by gallium arsenide deposition at temperatures of 550° to 650° C. and/or in an atmosphere containing from 2 to 10 ppm of oxygen. Since the insulating portion need not be relied upon for current conduction, the majority charge carriers can be of either N or P conductivity type or the insulating portion can be substantially intrinsic.

The waveguide region, lying entirely within the channel formed by the substrate, has its lateral extent defined by the isolating portion of the substrate and its lower wall 112 defined by the more conductive portion of the substrate. Adjacent the lower channel wall the waveguide region is comprised of a gallium arsenide lower capping layer 114 typically having an N type conductivity ion concentration of from $10^{17}$ to $5 \times 10^{18}$ ions per cubic centimeter. Lying immediately above the lower capping layer is a lower cladding layer 116 of N conductivity type. Lying above the lower cladding is an upper cladding layer 118 of P conductivity type. Each cladding layer can be comprised of aluminum arsenide or gallium aluminum arsenide containing up to 90 mole percent gallium. The cladding layers each typically have a conductivity imparting ion concentration of from $10^{16}$ to $10^{18}$ ions per cubic centimeter, but typically each contain a somewhat lower conductivity imparting ion concentration than the capping layer with which it is in contact. Interposed between the upper and lower cladding layers is an active layer 120. The active layer normally contains a lower conductivity imparting ion concentration than either of the cladding layers it contacts. That is, the cladding layer normally contains less than $10^{18}$ conductivity imparting ions per cubic centimeter and can be as nearly intrinsic as can be conveniently realized. Additionally, the active layer contains less aluminum than either of the cladding layers and less aluminum than the isolating portion of the substrate.

Capping layer 122 is in contact with the upper cladding layer. The upper capping layer is preferably comprised of gallium arsenide having a P type conductivity imparting ion concentration of greater than $10^{19}$ ions per cubic centimeter. The upper surface of the upper capping layer lies along the planar surface of the waveguide within a μm and typically within about 3000 Angstroms of the plane of the first major surface of the substrate. As shown the first major surface of the substrate and the upper surface of the capping layer are shown in their ideal, coplanar relationship.

To form the waveguide 100 according to the process of the present invention a monocrystalline gallium arsenide wafer is provided having properties corresponding to those of the conductive portion 104 of the substrate. The wafer thickness is chosen to make efficient use of material while permitting manipulation during processing without damage. While in practice a plurality of waveguides are formed in laterally offset relation on a single wafer, the description which follows is in terms of forming a single waveguide, since the process steps are the same.

Onto the wafer forming the more conductive portion 104 of the waveguide substrate a monocrystalline layer is epitaxially grown forming the isolating portion 106 of the substrate. The isolating portion is typically grown to a thickness of from about 3 to 10 μm, optimally from about 4 to 8 μm. Formation of the substrate can be achieved by any convenient conventional means.

Figure 2:
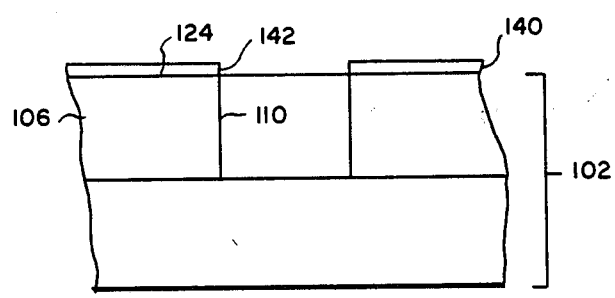
FIGS. 2, 3A, and 3B are schematic sectional details showing alternative channels.

Referring to FIG. 2, to begin construction of the waveguide a protective layer 140 is formed on the first major surface 124 of the isolating portion 106 of the substrate 102. The protective layer forming material can be selected from among a variety of known materials which are stable at required processing temperatures and which can be readily removed in at least selected areas. Examples of such materials are silica ($SiO_2$), silicon nitride ($Si_3N_4$), and refractory metals as well as their oxides and silicides—e.g., tungsten, tungsten oxide, and tungsten silicide. The layer need be no thicker than is required to assure pin hole free coverage of the first major surface and in any event is less than about 3000 Angstroms in thickness, preferably from about 500 to 2000 Angstroms in thickness.

Initially the protective layer overlies the entire first major surface. To locate the waveguide region in the substrate an opening 142 is first formed in the protective layer, and the substrate is then etched through the opening to form the channel 110. The opening in the protective layer can be formed by conventional photomasking and etching steps. For example, the protective layer can be overcoated with a layer of a conventional photoresist, imagewise exposed, and developed to define an opening in the photoresist layer corresponding to the location of the opening in the protective layer desired. The protective layer can then be etched through the openings in the photomask to define the desired openings. A variety of suitable conventional etching techniques are known, as illustrated by the various etching techniques outlined in Sugishima et al U.S. Pat. No. 4,352,724.

After every material removal step, regardless of whether the material being removed is from the substrate itself or an associated conductive or insulative layer, it is conventional practice to follow up immediately with a washing step to assure maintenance of the high levels of cleanliness required for successful semiconductor device yields. Typically deionized water is used for washing. To avoid repetitive references to washing, it is to be understood that a washing step, though not specifically described, preferably follows each step calling for removal of any material, particularly any step calling for material removal by etching.

Since the protective layer is comparatively thin, it is normally immaterial whether isotropic or anisotropic etching conditions are employed to form the opening. The same comment does not apply to forming the channel. The side walls of the channel are shown to be perpendicular to the first major surface of the substrate. However, alternative orientations are possible and can be employed to advantage. To appreciate the alternatives some appreciation of the substrate crystal structure is required.

The Group III-V compounds which form the substrate and waveguide region all form essentially similar cubic crystal lattices of the zinc blende type, and their lattice constants are essentially similar—e.g., 5.63 Angstroms for gallium arsenide and 5.66 Angstroms for aluminum arsenide. The common crystalline class and the close similarity in lattice spacings facilitates epitaxial deposition of materials differing in the selection of aluminum or gallium as the Group III ions.

As normally prepared the major surfaces of the substrate lie in {100} crystallographic planes. By employing known etching conditions the substrate can be etched essentially isotropically through the opening in the protective layer, with a certain amount of undercutting of the protective layer occurring. Alternatively, anisotropic etching can be achieved which reduces undercutting of the protective layer. Under anisotropic etching conditions the lateral walls of the channel are defined by the more thermodynamically stable crystallographic planes of the crystal structure. The {111} crystallographic planes are the most stable and can be revealed selectively by anisotropic etching to form the side walls of the channel. Any conventional anisotropic etchant can be employed. One preferred anisotropic etchant capable of efficiently revealing {111} channel side wall is a 5:1:1 volume ratio mixture of $H_2O:H_2SO_4:H_2O_2$. Another suitable anisotropic etchant is a 2 percent by weight bromine dissolved in methanol.

The {111} crystallographic planes intersect {100} crystallographic planes at a 55° angle. Two entirely different {111} crystallographic plane channel side wall orientations are possible, as can be appreciated by reference to FIGS. 3A, 3B, and 4. FIG. 4 is an isometric detail showing two possible alternative, mutually perpendicular channel orientations. Each of the channels 110a and 110b to be formed by etching is aligned with one of two mutually perpendicular sets of <110> vectors lying in the {100} first major surface of the substrate.

Figure 3A:
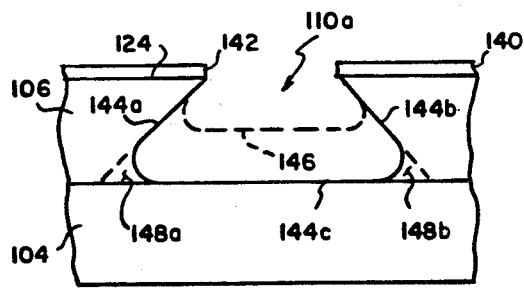
Figure 3B:
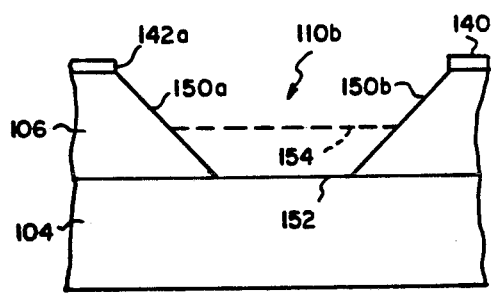
Figure 4:
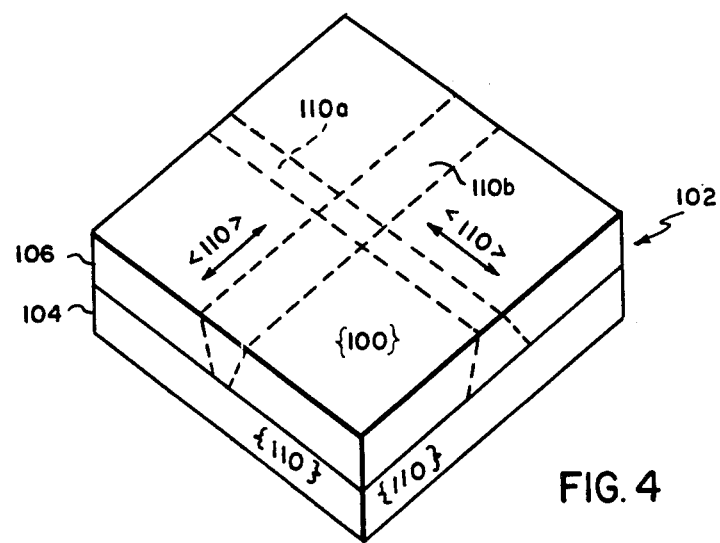
FIG. 4 is an isometric detail showing alternate channel orientations possible on a single substrate.

FIG. 3A illustrates the channel side walls which result when the channel longitudinal axis is oriented parallel to one set of <110> vectors on the {100} crystallographic plane forming the first major surface while FIG. 3B illustrates the channel side walls which result when the channel longitudinal axis is oriented parallel to a second set of <110> vectors on the {100} crystallographic plane forming the first major surface, where the two sets of <110> vectors are mutually perpendicular. The direction of <110> vectors on a {100} crystal surface can be determined by light diffraction patterns on the crystal surface, as is well understood. However, discrimination between the two sets of <110> vectors for purposes of choosing the side wall orientation of the channel created by etching requires a trail etching step in an expendable area of the substrate wafer being processed.

In FIG. 3A a structure is shown similar to that of FIG. 2, with like elements assigned like reference numbers. The difference in the FIG. 3A structure is the configuration of the channel 110a. In this structure the channel is formed by two opposed side walls 144a and 144b and a bottom wall 144c. The bottom wall is shown lying along the interface of the substrate portions 104 and 106—i.e., in a {100} crystallographic plane. The side walls diverge linearly from the protective layer opening toward the substrate portion 104 and then curve back to join the bottom wall. The linear portion of each side wall lies in a different {111} crystallographic plane. Dashed line 146 shows the lower boundary of the channel at an intermediate stage of etching. From observing channel boundaries at intermediate stages of etching the manner in which the more thermodynamically stable {111} crystallographic planes define the channel side walls can be appreciated. The regions 148a and 148b, each defined by extrapolations of the lateral wall limiting {111} crystallographic plane and bottom wall defining {100} crystallographic plane, are not normally removed by etching, but should be removable if the rate of etching along the bottom wall is slowed, as by introducing an etch resistant layer in the substrate during its formation. However, the rounding of the channel side walls at their intersection with the bottom wall is advantageous in that the necessity of epitaxy at the areally constricted oblique intersections of the {111} and {100} planes is avoided, thereby facilitating epitaxy on all channel walls.

In FIG. 3B a somewhat broader opening 142a is shown, since the side walls 150a and 150b of the channel 110b converge toward the channel bottom wall 152. Dashed line 154 represents the bottom wall at an intermediate stage of etching. It is to be noted that in this instance side walls entirely conform to {111} crystallographic planes and that the angles of intersection of the side walls and the bottom wall are obtuse, which facilitates epitaxial deposition at the intersections of the {100} and {111} crystallographic planes.

Since by definition a <110> crystallographic vector is oriented perpendicular to {110} planes, it follows that there are two sets of mutually perpendicular {110} crystallographic planes each intersecting the first major surface of the substrate at right angles. For example, in FIG. 4, two near edges of substrate are visible. Each near edge lies in a {110} crystallographic plane. Referring back to FIGS. 1 and 2 it is therefore apparent that the side walls of the channel 110 can be oriented to lie in {110} crystallographic planes. By a suitable etchant choice, it should be possible to form a channel with side walls lying in {110} crystallographic planes and a bottom wall lying in a {100} crystallographic plane. In this regard it is to be noted that the substrate surfaces formed by {110} crystallographic planes are more thermodynamically stable during etching than the surfaces formed by {100} crystallographic planes. Thus, etching would be expected to proceed anisotropically, deepening the channel bottom wall while exhibiting little undercutting of the protective layer.

Once a channel has been found in the substrate of the desired configuration and depth, the next step is to deposit epitaxially III-V compound selectively in the channel formed so that deposition occurs only in the channel and not on the protective layer. To achieve this goal of selective site deposition of the III-V compound care must be undertaken in the choice of deposition conditions.

A preferred procedure for depositing III-V compound only on the unprotected or exposed surfaces of the substrate lying in the channel employs selected conditions of organometallic vapor phase epitaxy. The substrate in any one of the forms shown in FIGS. 2, 3A, or 3B is placed in a vacuum chamber where it is heated to a temperature in the range of from 500° to 800° C., preferably in the range of from 650° to 750° C. The pressure in the vacuum chamber is reduced to less than 50 torr., preferably less than 10 torr. At the same time an atmosphere is provided in the vacuum chamber comprised of arsine ($AsH_3$) and one or a mixture of organo-aluminum and organo-gallium gases—e.g., trimethyl or triethyl aluminum or gallium. The aluminum and gallium ratio are dictated by the ratio of these metals desired in the epitaxy being deposited on the substrate. A molar excess of the arsine gas is maintained. A molar ratio of vapor phase arsine to total vapor phase aluminum and gallium of from about 2:1 to 100:1 is maintained.

Deposition is continued until the epitaxy deposited in the channel forms with the first major surface of the substrate an overall planar surface—i.e., until the surface of the epitaxy in the waveguide region lies within about a $\mu$m of the first major surface of the substrate, preferably within about 3000 Angstroms of the first major surface.

To provide the III-V compound being deposited in the waveguide region with the desired concentration of N or P conductivity type ions one or more N or P dopant materials are introduced into the vacuum chamber as vapor phase compounds along with the other gases. N type dopants, such as silicon, selenium, sulfur, tellurium, tin, and germanium, can be introduced as vapor phase compounds, such as silane, hydrogen selenide, germanium hydride, dialkyl telluride, or tetraalkyl tin while P type dopants, such zinc, cadmium, beryllium, and magnesium, can be introduced as the corresponding dialkyl compounds, where alkyl in each instance is independently methyl or ethyl. Except for the particular vacuum chamber conditions noted, doping procedures can generally follow the conventional practices of the art.

In depositing III-V compounds in the channel to form the waveguide different crystal faces bounding the channel can affect the relative rates of epitaxial deposition. There appears to be a preference for deposition onto {111}, {110}, and {110} in that order of preference. Thus, exposed {111} crystal faces appear to accept epitaxy at a somewhat higher rate than the remaining crystal faces. In epitaxially depositing into channels bounded by {111} side walls, as shown in FIGS. 3A and 3B, this can result in some bending of the layers at their edges. Edge contouring of the various epitaxial layers can be employed to advantage, if desired. Even where edge contouring of the successive epitaxially deposited layers is observed, the contouring effect is not incompatible with obtaining the desired final planar surface configuration. Since contouring results from interaction with the substrate channel walls, once epitaxy covers these walls, the successive deposition favors restoring planarity to the upper surface of the epitaxy. Edge contours of waveguide region layers can be minimized by maintaining the channel depth small in relation to its width. Where the channel is initially bounded by side walls lying in {110} crystallographic planes, the slower deposition onto walls of this crystallographic orientation favors the deposition of flat layers essentially free of edge contours, as shown in FIG. 1.

According to the preferred practice of the invention the waveguide region epitaxy is grown just to or slightly below the first major surface of the substrate to form a planar surface extension of the first major surface—i.e., a surface that lies within about a $\mu$m and preferably within about 3000 Angstroms of the first major surface. Continued growth of the epitaxy within the ordinary relief tolerances of planar surfaces can be performed, but is preferably avoided. Epitaxial deposition in the waveguide region above the channel results in edge bounding of the epitaxy by {111} crystallographic planes. Since such planes are canted at 55° with respect to the first major surface of the substrate, this produces an overhand that creates disadvantages in further processing to produce a completed waveguide.

Once the waveguide region has been completed, subsequent processing to produce a completed device can be undertaken by well known, conventional techniques. The protective layer used for directing epitaxy selectively to the channel can remain as a permanent layer of the completed device or can be removed and replaced by an insulative layer, such as layer 130 in FIG. 1. Alternately, these two layers can be used together. It is to be noted that the insulative layer 130 as shown in FIG. 1 covers a portion of the waveguide to limit the lateral extent of the second electrode 134 with the waveguide region. This arrangement can be used to advantage to combine gain guiding with positive index guiding of the laser. When the waveguide takes the form of a laser, it is typically cleaved from the wafer in which it is formed so that two parallel smooth mirror edges intersect the channel containing the waveguide region. These mirror edges interact with the waveguide region to increase the emission efficiency of the completed laser.

While the invention has been described with reference to certain preferred embodiments, it is appreciated that numerous modifications can be undertaken, the relative merits of which will depend upon the specific user application being addressed. For example, it is not necessary that the waveguide region contain five separate layers as shown in FIG. 1. The capping layer 114 is most readily omitted, and the capping layer 122 can also be omitted, if desired. Beyond this, the waveguide region need not form a laser. A simple, non-lasing waveguide can be formed according to the process of this invention merely by epitaxially depositing in the channel a single III-V compound. The III-V compound can take any one of the forms described above for the various laser layers, provided the positive index relationship is maintained for waveguiding.

The substrate 102 has been shown to be comprised of both conductive portion 104 and isolating portion 106; however, only the isolating portion is essential. Thus, a unitary substrate can be formed in which a wafer having the composition of the isolating portion is provided and etched to form channels therein without any intervening step of epitaxially depositing additional III-V compound thereon.

In epitaxially depositing in the channel to form a laser it is possible to deposit a single, lightly doped or nearly intrinsic III-V compound. Thereafter by suitable photomasking N and P conductivity type ions can be implanted into the waveguide region in laterally spaced relation to leave an active region therebetween. While such lasers lack the efficiency of the preferred laser constructions, they can be put to practical use.

The invention has been described in detail with particular reference to preferred embodiments thereof, but it will be understood that variations and modifications can be effected within the spirit and scope of the invention.

What is claimed is:

1. A process of preparing a waveguide comprising
providing a monocrystalline substrate comprised of a III-V semiconductor,
epitaxially growing on the substrate one or more additional layers of a III-V semiconductor differing from the substrate semiconductor,
the substrate and the layers together forming a monocrystalline III-V compound structure, wherein the group V ions are arsenic and the group III ions are at least one of gallium and aluminum,
characterized in that a laterally confined positive index waveguide is formed by
providing a substrate having adjacent one major surface a monocrystalline gallium aluminum arsenide isolating portion having a resistivity greater than $10^5$ ohm-cm epitaxially grown on an underlying portion of said substrate,
providing on the one major surface, a protective layer defining an opening,
through the opening creating a channel in the substrate to expose an unprotected portion of the substrate beneath the one major surface the channel having walls at least in part defined by the gallium aluminum arsenide isolating portion and
forming a waveguide region by selectively depositing epitaxially from a vapor phase gallium arsenide or gallium aluminum arsenide of a higher refractive index than the monocrystalline gallium aluminum arsenide forming the walls on only the unprotected portion of the substrate forming the channel.

2. A process according to claim 1 wherein the substrate is formed with a more conductive portion comprised of gallium arsenide or gallium aluminum arsenide having a concentration of greater than $5 \times 10^{17}$ conductivity imparting ions per cubic centimeter and the channel is formed so that it extends through the lateral isolation medium to the more conductive portion.

3. A process according to claim 2 in which the substrate presents a {100} crystal face and the longitudinal axis of the channel is formed along a <110> vector.

4. A process according to claim 3 in the channel is formed with side walls lying in {111} crystal planes.

5. A process according to claim 4 in which the side walls diverge in a direction away from the substrate surface.

6. A process according to claim 4 in which the side walls converge in a direction away from the substrate surface.

7. A process according to claim 1 in which gallium arsenide is selectively deposited in the channel by a vapor phase double decomposition reaction of arsenic and gallium compounds at a temperature of from 500° to 800° C. from an atmosphere of less than 50 torr.

8. A process according to claim 7 in which the epitaxial deposition is undertaken at a pressure of less than 10 torr.

9. A process according to claim 7 in which the epitaxial deposition is undertaken at a temperature of from 650° to 750° C.

10. A process according to claim 1 in which gallium arsenide or gallium aluminum arsenide is selectively deposited epitaxially in the channel by a vapor phase double decomposition reaction of arsine and at least one of trialkyl gallium and trialkyl aluminum, where alkyl is independently methyl or ethyl.

11. A process according to claim 1 in which gallium aluminum arsenide forming the channel walls of the isolating portion exhibits a resistivity of greater than $10^7$ ohm-cm.

12. A process according to claim 1 in which P and N conductivity type regions are both formed within the channel.

13. A process according to claim 12 in which a laser is formed within the channel with the P and N conductivity type regions acting as cladding regions separated by an active region.

14. A process according to claim 13 in which the wave propagation medium is formed of N and P conductivity type cladding regions of aluminum arsenide or gallium aluminum arsenide containing from $10^{16}$ to $10^{18}$ conductivity imparting ions per cubic centimeter and an intervening active layer of gallium arsenide or gallium aluminum arsenide containing less aluminum than either of the cladding regions and less aluminum than the isolation medium.

15. A process according to claim 1 in which the protective layer is formed of silica or silicon nitride.

16. A process according to claim 1 in which epitaxial deposition is terminated when the surface of the waveguide region lies within a micrometer or less of the first major surface of the substrate.

17. A process according to claim 16 in which epitaxial deposition is terminated when the surface of the waveguide region lies within 3000 Angstroms or less of the first major surface of the substrate.

18. A process of preparing a laser comprising
providing a monocrystalline substrate comprised of a III-V semiconductor,
epitaxially growing on the substrate N and P conductivity type cladding layers having a concentration of $10^{16}$ to $10^{18}$ conductivity imparting ions per cubic centimeter separated by an active layer,
the substrate and the layers together forming a monocrystlline III-V compound structure, wherein the group V ions are arsenic and the group III ions are at least one of gallium and aluminum,
characterized in that a laterally confined positive index laser presenting a planar surface is formed by
providing a first substrate portion having a conductivity imparting ion concentration of from 1 to $3 \times 10^{18}$ ions per cubic centimeter,
epitaxially growing on the first substrate portion an isolating substrate portion being comprised of gallium aluminum arsenide containing from 30 to 60 mole percent aluminum and having a resistivity of greater than $10^7$ ohm-cm, said isolating substrate portion forming one major surface of the substrate,
providing on the one major surface a protective layer of silica or silicon nitride defining an opening,
through the opening creating a channel in the substrate through the isolating substrate portion of the first substrate portion to expose an unprotected portion of the substrate beneath the one major surface,
forming a laser waveguide region by selectively depositing epitaxially in sequence
a first gallium arsenide layer having a first conductivity type ion concentration of from $10^{17}$ to $5 \times 10^{18}$ ions per cc,
a first cladding layer comprised of aluminum arsenide or gallium aluminum arsenide containing at least 90 mole percent aluminum having a first conductivity type ion concentration of from $10^{16}$ to $10^{19}$ ions per cc,
an active layer comprised of gallium arsenide having a substantially lower conductivity imparting ion concentration than the first cladding layer,
a second cladding layer comprised of aluminum arsenide or gallium aluminum arsenide containing at least 90 mole percent aluminum having a second conductivity type ion concentration of from $10^{16}$ to $10^{18}$ ions per cc, and
a surface gallium arsenide layer having a second conductivity type ion concentration of greater than $10^{19}$ ions per cc,
epitaxially depositing the laser waveguide layers selectively in the channel and on the gallium aluminum arsenide isolating portion of the substrate forming side walls of the channel by conducting deposition at a temperature in the range of from 650° to 750° C. at a pressure of less than 10 torr. from an atmosphere comprised of arsine gas and at least one of trialkyl aluminum and trialkyl gallium gas, alkyl being independently in each occurrance selected from methyl and ethyl, with the ratio of arsine to remaining gas being from 10:1 to 30:1.
terminating epitaxial deposition with the surface gallium arsenide layer lying at or beneath the one major surface by a distance of 3000 Angstroms or less to form a planar surface therewith, and
depositing on the planar surface at least one layer bridging the substrate and the laser waveguide region,
so that the laser waveguide region acts as a wave propagation medium, the epitaxially deposited substrate portion acts as a lateral isolation medium for the waveguide region, and the planar surface formed by the waveguide region and the substrate one major surface facilitates formation of the bridging layer.

* * * * *